(12) United States Patent
Goetz et al.

(10) Patent No.: US 7,446,530 B2
(45) Date of Patent: Nov. 4, 2008

(54) NMR COIL HAVING INTEGRATED CAPACITIVE STRUCTURES

(75) Inventors: Jon Goetz, Fremont, CA (US); William Llanos, Fremont, CA (US)

(73) Assignee: Varian, Inc., Palo Alto, CA (US)

( * ) Notice: Subject to any disclaimer, the term of this patent is extended or adjusted under 35 U.S.C. 154(b) by 55 days.

(21) Appl. No.: 11/636,321

(22) Filed: Dec. 8, 2006

(65) Prior Publication Data

US 2008/0136416 A1    Jun. 12, 2008

(51) Int. Cl.
*G01V 3/00* (2006.01)
(52) U.S. Cl. .................. 324/318; 324/322
(58) Field of Classification Search ............. 324/318, 324/322
See application file for complete search history.

(56) References Cited

U.S. PATENT DOCUMENTS

| | | | | |
|---|---|---|---|---|
| 4,737,715 A * | 4/1988 | Ikeda et al. | ................. | 324/318 |
| 6,377,047 B1 * | 4/2002 | Wong et al. | ................. | 324/318 |
| 6,876,200 B2 | 4/2005 | Anderson et al. | | |
| 7,023,210 B1 * | 4/2006 | Finnigan | .................... | 324/318 |
| 7,064,549 B1 | 6/2006 | Hudson | | |
| 7,132,829 B2 | 11/2006 | Hudson et al. | | |
| 7,304,277 B2 * | 12/2007 | Weber | ....................... | 219/674 |

* cited by examiner

*Primary Examiner*—Louis M Arana
(74) *Attorney, Agent, or Firm*—Bella Fishman; Edward H. Berkowitz

(57) ABSTRACT

An NMR probe includes a coil former on which the resonant capacitance and/or tune and match capacitances are integrally implemented. Adjustable capacitances are realized in combination with a composite former including a slip glass for support of a capacitor plate. Particular advantages are realized in the context of cryostatic NMR probes.

18 Claims, 4 Drawing Sheets

NMR COIL HAVING INTEGRATED CAPACITIVE STRUCTURES

BACKGROUND OF THE INVENTION

This work is in the field of nuclear magnetic resonance (NMR) and relates particularly to the NMR probe, that is to say, a structure for inductive coupling of nuclear spins to the excitation and signal acquisition channels of an NMR apparatus.

The central component of an NMR probe is a resonator, or tuned circuit for inductively coupling to the nuclear spins of a sample introduced into the resonator. The resonator is frequently referenced as a "coil" comprising axially extending inductive members distributed azimuthally around, and radially outside the sample vessel. The resonance properties of the coil are established with capacitive reactance furnished in parallel or in series with the coil. The inductive members may be interconnected together to form diverse coil topologies, such as saddle coils, birdcage coils, millipede coils, spirals, series or parallel Helmholtz pairs, etc. The capacitive reactance necessary for the resonance condition is often derived from distributed capacitance or a lumped capacitive component such as a chip capacitor (in modern usage).

The resonator requires tuning and matching to an RF source or sink communicating with the resonator. Prior art has typically disposed the capacitance(s) forming a tune and match network at some remove from the coil terminals. These arrangements also comport with the desire to minimize the presence of components unnecessarily close to the sensitive volume.

The cryogenic environment for modern NMR probe apparatus enables very high Q values for the resonator and thus significantly improved signal-to-noise performance. The cryogenic environment is also characterized by a vacuum space for thermal isolation requirements. Residual gasses in this vacuum environment respond to the presence of electric fields consequent to high voltages on the RF components through ionization-recombination processes and this contributes to the noise. A cryogenic environment also imposes thermal limitations on the resonator structure.

It is known to construct lumped capacitances in proximity to an NMR probe coil to implement the desired resonant circuit. Certain structures of such type are presented in U.S. Pat. Nos. 7,064,549 and 7,132,829, both assigned to Varian, Inc. with the present work. That prior art described conducting rings of prescribed area enclosing the coil structure, forming so-called "capacitance bands" in order to provide resonant capacitance for an NMR probe coil.

It is also known in prior art to construct a birdcage coil by supporting the longitudinal members, or rungs, on one surface (either inner or outer) of a hollow dielectric cylinder and identical aligned longitudinal conducting members on the opposite surface, thereby forming a capacitive rung for a birdcage coil. These conducting members are formed from a foil disposed on the respective surfaces. An example is U.S. Pat. No. 6,876,200 assigned to Varian, Inc. In this and similar usage, the resonant capacitance is furnished as a distributed capacitance, geometrically non-independent of the inductive component(s) of the resonant circuit. This presents a constraint on the implementation of the resonant circuit.

SUMMARY OF THE INVENTION

This present work is directed to a balanced NMR coil structure featuring lumped capacitance(s) disposed directly on the coil former as an integral component of the coil former, but remaining separate and independent of the inductive members of the coil. These capacitances comprise portions of the tune and match capacitance networks for the balanced resonant coil (resonator) as well as the capacitance required for support of the resonant condition. Capacitance networks are required with NMR probes for tuning and matching the resonator to its RF source or sink. A basic result of this arrangement is the reduction of RF voltage difference between the coil leads, and several further results deriving from this voltage reduction, thereby adding utility to NMR probe design and operation. The capacitance network is ordinarily located well outside and somewhat remote from the sensitive volume defined by the coil geometry. This arrangement avoids disturbing influences close to the sensitive volume.

One or more capacitances, disposed immediately proximate to coil terminals are built directly on the coil form. The conductive material for this purpose is, preferably, susceptibility matched, as is the coil itself, to avoid discontinuities in the magnetic susceptibility distribution in this region. These capacitances provide resonant circuit capacitance and/or tune and match functions for the coil with the result of providing a relatively lower RF voltage difference between the RF leads as compared with the standard practice of locating a parallel lumped capacitance remote from the coil terminals and away from the sensitive volume, as well as remotely locating capacitance networks for tuning and matching the coil to its source and/or sink. The higher RF potential along conventional relatively lengthy leads from the capacitance networks enhance radiative losses and thus lower efficiency. In the context of modern cryogenic NMR probes, the Q of the coil is of the order of as much as several times $10^3$. Because of the very high Q, the RF voltage at the coil terminals can be very large compared to the voltage realized at the RF input at selected power and matched to 50 ohms. A peculiarity of the cryogenic context, for this apparatus, is the near vacuum environment of the coil cryostat. Taken together with the relatively high RF electric field between leads, these environmental effects contribute noise from ionization/recombination processes of the residual gasses in the vacuum spaces due to the high RF power density in operation. Consequently, the reduced RF voltage diminishes this noise constituent.

Further, in the cryogenic context, the preferred substrate for the integrated capacitance structure of the present work, is sapphire, a material of excellent dielectric and thermal conductivity. The structure described here provides a very intimate thermal coupling of capacitive constituents to the relatively large sapphire coil form resulting in improved thermal transport of heat away from the resonator.

BRIEF DESCRIPTION OF THE DRAWINGS

FIG. 2b is a circuit of a resonator of the present work, functionally similar to FIG. 2a.
FIG. 4b is a diametrically opposite view of the embodiment of FIG. 4a.

DETAILED DESCRIPTION OF THE INVENTION

Figure 1:
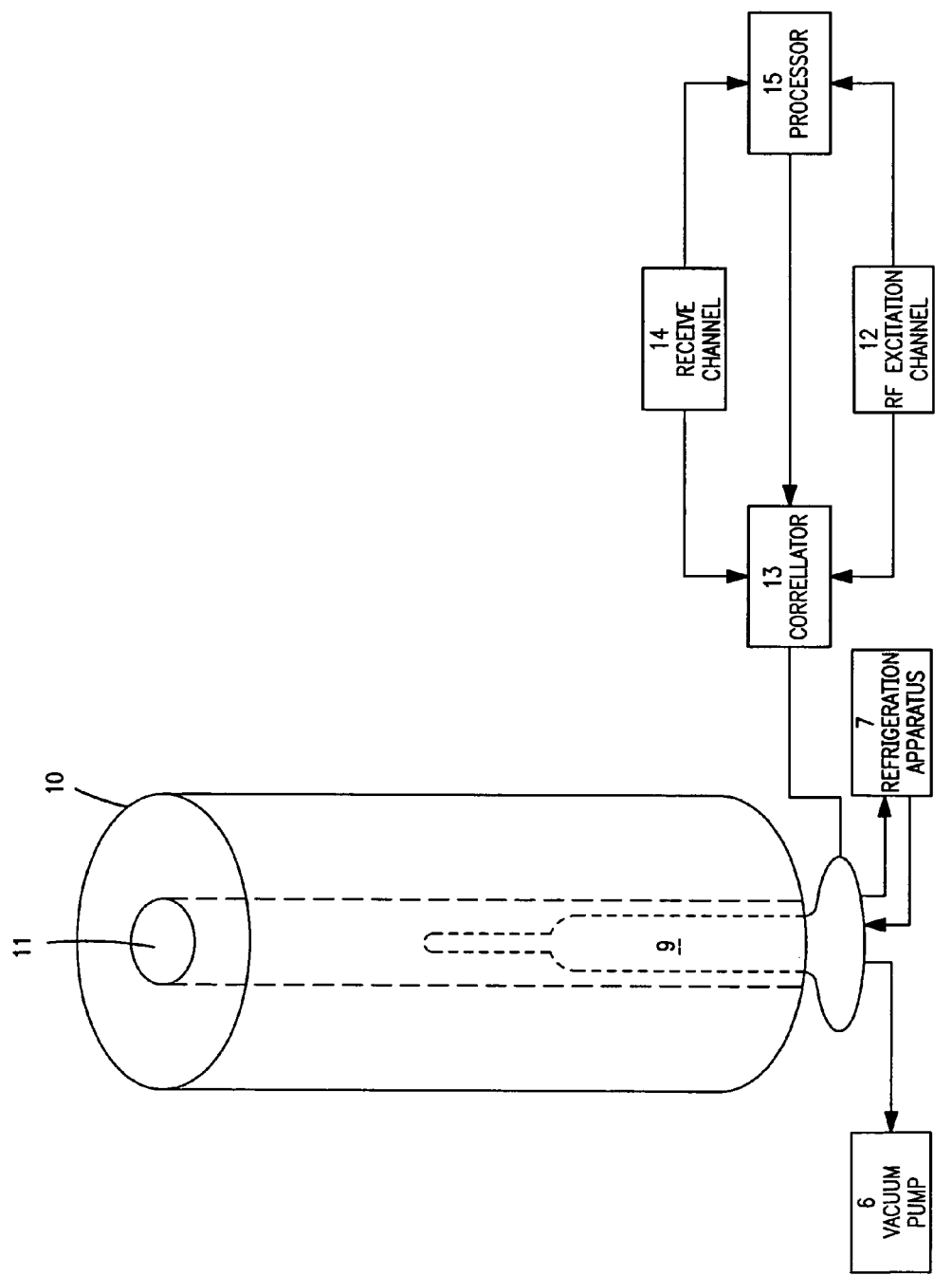
FIG. 1 describes the conceptual context of this work.

FIG. 1 serves to illustrate conceptually the context of this work within an NMR system. An NMR probe 9 is disposed within the bore 11 of a superconducting magnet 10. A sample for analysis is presented in a sample vessel (not shown) inserted in the probe 9. The probe 9 inductively couples to the nuclear spins of the sample for excitation through at least a first RF excitation channel 12 and separately for signal acquisition through a receive channel 14. Excitation and receive functions often share a common probe coil for non-concurrent operation through correllator 13, but multiple coils are frequently employed to serve different functions, such as to furnish spin decoupling, field-frequency lock, and the like. The receive channel ordinarily includes a preamplifier and RF demodulator, phase detector, analog-to-digital conversion (ADC) and various signal processing apparatus together with a digital processor 15 to effect averaging, Fourier transformation, storage and the like. In like manner, processor 15 controls both the excitation channel 12 and receive channel 14. More recently, some of these functions are consolidated in a direct digital receiver, but these variations are not critical to the understanding or operation of the present probe. An input/output module provides for instruction of the processor 15, provision for display of data and general operator intervention. In the cryogenic context, there is included refrigeration apparatus 7 and vacuum pumping apparatus 6.

Figure 2B:
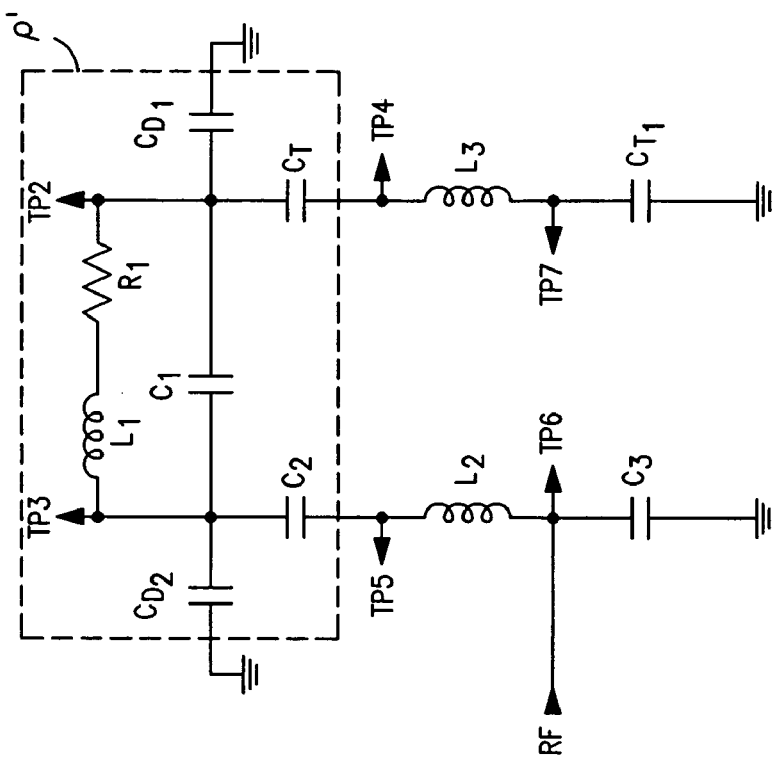
Figure 2A:
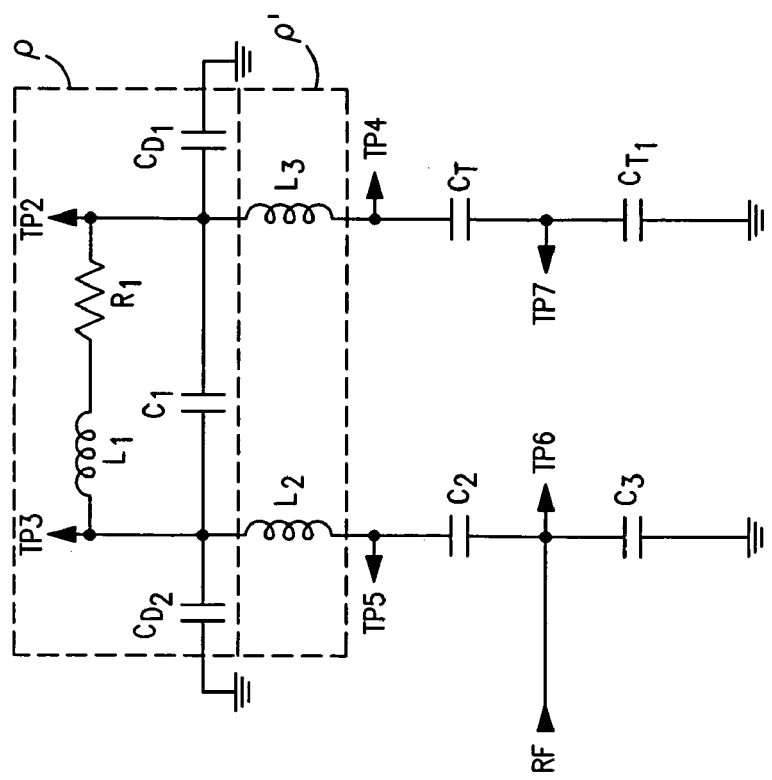
FIG. 2a is a circuit of a prior art probe.

FIG. 2a describes a typical prior art balanced resonant coil for NMR and its tune and match interface. A balanced resonator is characterized as exhibiting symmetry with respect to ground between its terminals. Consequently, the voltage difference between the leads from these terminals will be relatively high. The resonator ρ is an LC circuit loop, further including inductance $L_1$, lumped capacitance $C_1$, resistance $R_1$ and distributed capacitances $C_{D1}$ and $C_{D2}$ to ground. The resistance $R_1$ of the inductive component $L_1$ may be reduced to nil for a cryogenic probe below the superconducting transition temperature for the conductors forming the resonator ρ. The capacitances $C_{D1}$ and $C_{D2}$ may be parasitic, or designed as distributed capacitive contributions to the resonator. It should be remarked that the resonator may be implemented from a classic "coil" (saddle, birdcage, helical, etc.) or a more distributed form such as a slotted tube, Alderman-Grant resonator, or the like. For the purposes of this work, these distinctions are not generally relevant.

The resonator leads are represented by inductances $L_2$ and $L_3$ and these conductors are typically of a length approximating about one half the axial length of the magnet bore 11 to the base of the probe enclosure where a capacitive network is housed. The capacitive network shown here includes $C_2$ and $C_3$ for matching the resonator ρ to 50Ω. Capacitors $C_T$ and $C_{T1}$ accomplish a tuning function. The numbered arrows are referral points for discussion of the instantaneous voltage occurring at the respective point. The circuit of FIG. 2a is found in many commercial NMR probes. For an existing exemplary 900 MHz (proton resonance) cryogenic probe, $L_1$ may be 5 nH and $C_1$ about 5.7 pF. The parasitic and/or distributed capacitances total about 1 pF. The inductances $L_2$ and $L_3$ constituting the leads are each about 10 nH. The capacitive divider $C_2$ and $C_3$ contains respective values of about 0.5 and 5.32 pf respectively. For the divider $C_T$ and $C_{T1}$, the respective values are each about 1 pF.

FIG. 2b is the balanced NMR probe of the present work. The individual components being identical with the components of FIG. 2a, the labels are therefore unchanged. One observes that the difference between this circuit and the prior art of FIG. 2a is that the positions of the tune ($C_T$) and match ($C_2$) capacitors have been interchanged with the respective leads. Physically, $C_2$ and $C_T$ are physically present in very close proximity to the resonator. These two configurations (FIGS. 2a,b) were examined using the circuit analysis simulator "Genesis" (version 4.81, Eagleware, 2004). In each case 100 watt, 50 ohm RF input at frequencies ω is applied at the circuit point denoted by RF and the voltages resulting at the several circuit points were computed. The (peak) voltage obtaining at various selected points in the circuit(s) appears in Table 1. The salient result to be noted is the relatively high voltage difference between the coil terminals (TP4 and TP5) as compared with the much lower difference between voltages found at TP6 and TP7.

TABLE 1

| Voltage | FIG. 2a | FIG. 2b |
|---------|---------|---------|
| V(3, 2) | 4229 | 4258 |
| V(4, 0) | 2516 | 846 |
| V(5, 0) | 2534 | 423 |
| V(5, 6) | 2536 | 2560 |
| V(4, 7) | 1258 | 1268 |

One observes the expected similarity everywhere except for the striking difference in voltages on the leads. The greatly reduced voltage on the leads brings significant advantage to balanced NMR probe construction generally, and to cryogenic probes particularly as discussed below. It is somewhat surprising that a mere interchange in the relative position of series inductive and capacitive components yields the distinction demonstrated by Table 1, and other benefits discussed herein.

The prior art (FIG. 2a) and the present circuits use the same basic resonator ρ, e.g., identical Q, the same power impressed at the same terminals and (obviously) the same RF current, I, circulates between those terminals. The distribution of voltage difference(s) is different because the voltage drop across each lead (that is inductive elements forming leads $L_2$ and $L_3$) is IωL while the voltage drop across capacitors ($C_2$ and $C_T$) is I/(ωC).

Another qualitative distinction is found in recognition that in the prior art (FIG. 2a) leads $L_2$ and $L_3$ contribute to the resonator portion of the circuit in the sense that matching and tuning is directed to the composite resonator ρ inclusive of such leads. The present work associates the tuning and matching functions more directly with the resonator ρ', per se.

In the context of cryostatic NMR probe apparatus, with the reduction of the voltage (to ground) of the inductive leads it is appreciated that these leads reside in the vacuum environment of the probe cryostat interior. The ionization-recombination phenomena deriving from the high electric fields and the lead voltage is here reduced; thus, contribution to RF noise is similarly reduced.

Figure 3B:
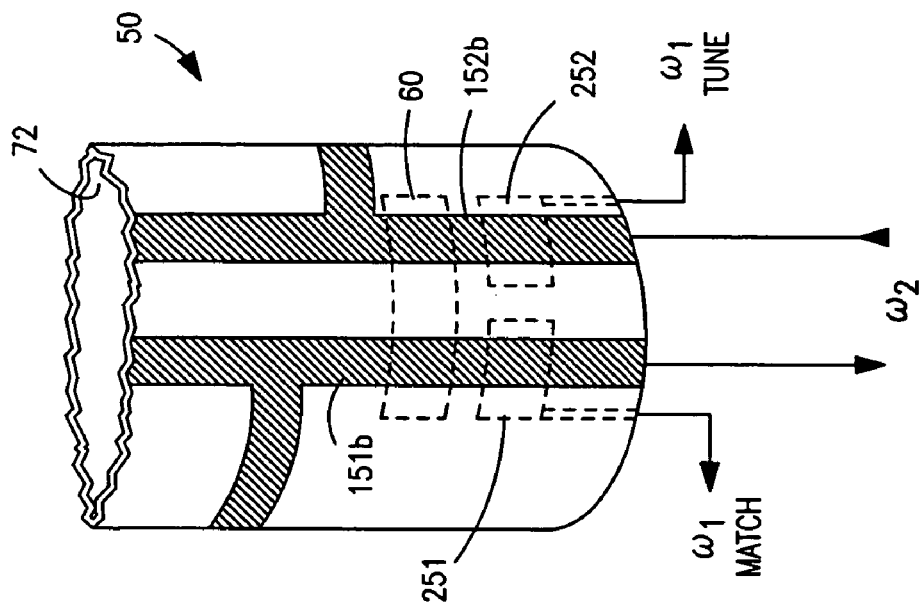
FIG. 3b is another embodiment of the present work.
Figure 3A:
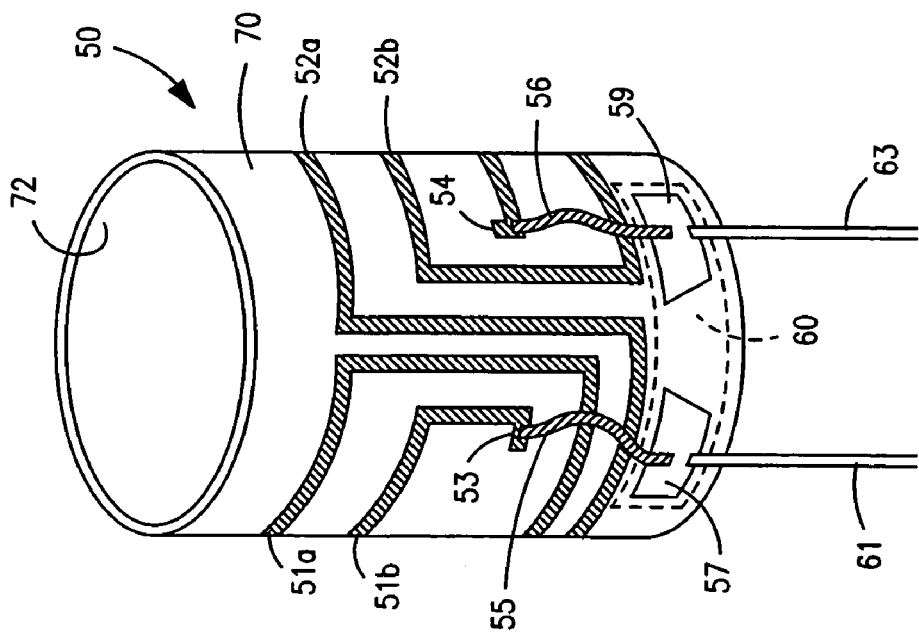
FIG. 3a shows one embodiment of this work.

Turning now to FIG. 3a there is shown as an example, a first embodiment in the form of a balanced multi-turn saddle coil. Saddle coil topology is referenced only for specificity and is not a limitation of the present work. Coil former 50, of selected radial thickness, comprises a selected insulator. Sapphire is a preferred material for its dielectric properties and for its high thermal conductivity in cryogenic applications. A long planar conductor furnishes inductive reactance in the form of a plurality of conducting loops 51a,b and 52a,b, where the numerals 51 and 52 refer to an exemplary case of a pair of serially connected multi-turn loops, in facing opposition. Each of the two loops comprises two turns denoted a and b. (The number of turns is neither critical nor limiting.) The loops are disposed in common on one surface of the former 50. It should be understood that either the inner (72) or outer (70) surface may be selected to support the loops 51, 52 partially shown as 51a, b and 51a, b. The conductor is a susceptibility compensated foil affixed to the supporting surface through a susceptibility compensated adhesive. Both such compensated conductors and adhesives are well known in the art. The loops occupy an axially central portion of the former 50 with ample portions of the former 50 extending axially in either axial direction to better displace any susceptibility discontinuity from proximity to the sensitive volume defined by the loops 51, 52. As illustrated in FIG. 3a by way of example, the turns of loop 51 are serially connected to the opposite helicity turns of loop 52. That particular topology is readily recognized as a classic saddle coil. It is again emphasized that the present work is not limited to the saddle coil arrangement and other forms of the inductive coupling geometry and electrical topology are consistent with the present work.

For the example of FIG. 3a, terminal points 53 and 54 of the coil have corresponding leads 55 and 56 electrically bonded thereto. A susceptibility compensated solder is one way to achieve a suitable bond. The respective distal ends of these leads 55, 56 are, in turn electrically bonded to corresponding pads 57 and 59, each of selected area and necessarily disposed on that same surface supporting the inductive loops 51, 52. For simplicity in exposition assume that the inductive loops of which portions 51a, b 52a, b are shown and the pads 57, 59 are disposed on the radially outward surface 70. In facing relationship to pads 57, 59 on the opposite surface (here taken as inner surface 72), another conducting surface 60 of selected axial dimension is disposed so as to form (via the dielectric properties of former 50) a capacitance of selected value in conjunction with pad 57 and another capacitance of selected value with pad 59 leads 61 and 63 complete the connection to external components. These effective capacitors are conveniently denoted in reference to the conductor pairs 60, 57 and 60, 59 and are clearly in parallel and form the circuit shown in FIG. 2b. The effective capacitors 60, 57 and/or 60, 59 may be adjusted by the simple expedient of reducing, at manufacture, the area of the affected pad 57 or 59. This capacitance is disposed across the coil terminals to form the parallel $L_1C_1$ resonator.

FIG. 3b represents one illustrative example of an arrangement where all three of the capacitances $C_1$, $C_2$ and $C_T$ are implemented on the coil former 50 in accord with this work. The resonating capacitance (e.g., $C_1$ of FIGS. 2a and 2b) is obtained with conducting surface 60 supported on one surface of former 50 (here shown as inner surface 72) in capacitive relationship with a portion of coil stubs 151b and 152b. A match capacitor is formed in the relationship with portion 151b and conducting surface portion 251 supported on the opposite surface (here, inner surface 72). In like manner, the tuning capacitance, "$\omega_1$ TUNE" is formed in the capacitive relationship of coil stub 152b and the conductor surface portion 252, here shown affixed to the inner surface 72 and the match capacitance, "$\omega_1$ MATCH" is formed in relation to the coil stub 151.

The structure as thus described, and independently of the precise topology of the coil, provides capacitive reactances for tuning and matching the balanced resonant circuit which are integrated by construction within the coil former. The resonant inductance is not limited to any particular geometry to enjoy the benefit of the present work. Any such inductance will have mechanical support and such support will comprise a dielectric material. However, a balanced electrical topology is understood to provide the greatest benefit.

Prior art resonators for particular employment in a cryogenic environment position a lumped capacitance displaced from the warm side of the cryogenically cooled coil and its immediate support, e.g., the cold head. In the cryogenic environment, the present development provides the resonant capacitance as well as portions of the tune and match capacitive network on the cold side of the cold head. In the cryogenic environment, sapphire is a preferred material to employ as mechanical support, or coil former for the resonant inductance. This preference derives from the independently excellent thermal as well as dielectric properties. Thermal conductivity of sapphire at 20° K is about 3500 watts/meter (compared to about 1 watt/meter for quartz). The NMR application is a thermal non-equilibrium environment and an appropriate thermal communication path through a thermally conductive support member of the cold head is thereby facilitated for rapid thermal equilibration of resonator components.

The capacitances realized in the present work compare favorably in thermal performance with chip capacitors. The preferred sapphire former presents a relatively large area for thermal transfer through the cold head to a heat exchanger. By way of comparison, heat dissipated in a chip capacitor is transported through the electrical leads and/or the ceramic package of the capacitor. In high power usage common to NMR apparatus, the thermal mismatch has often been found to lead to failure of such components. The integrally constructed capacitances used herein present a more thermally matched heat sink for the NMR probe, whether operating at either ambient or cryogenic environment in either static or dynamic thermal equilibrium.

The capacitive elements are realized in any of a variety of ways. Foil conductors applied with an adhesive; coatings obtained by masked evaporation in vacuo, are simply examples. The capacitive element is trimmed or otherwise partially removed to obtain the desired value of capacitance during construction.

Figure 4A:
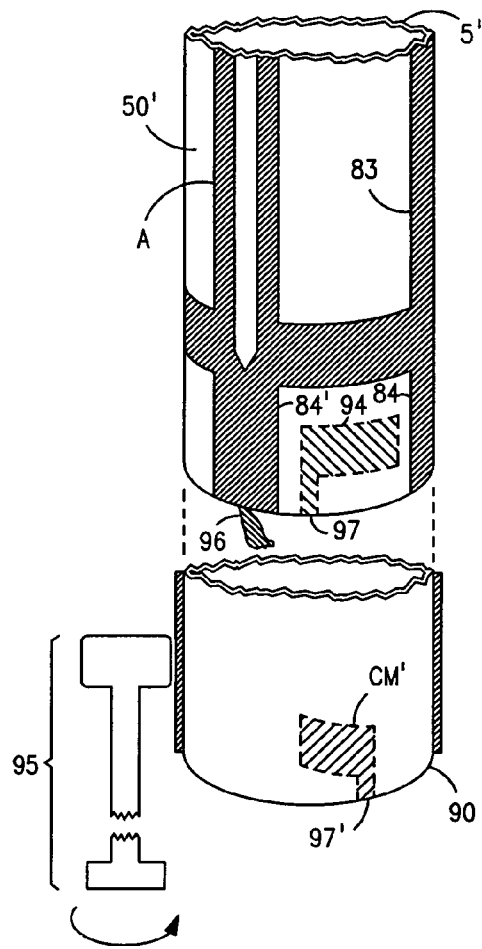
FIG. 4a is a slip glass adjustable capacitor embodiment.
Figure 4B:
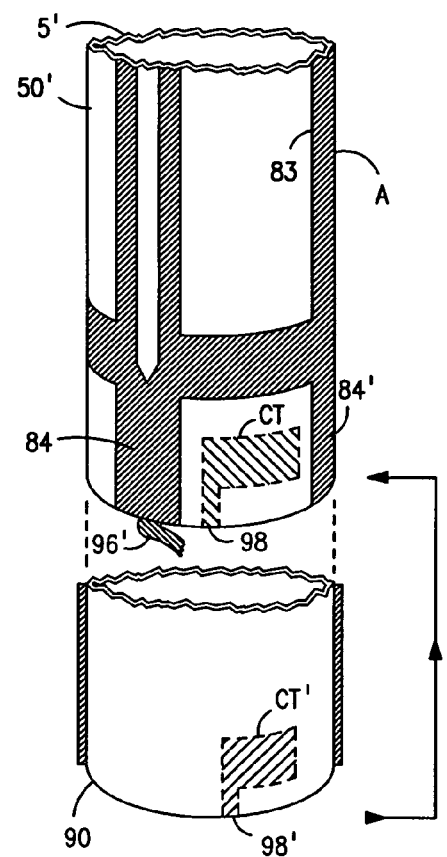

Yet another embodiment is shown in FIGS. 4a and 4b for a double turned probe (frequencies W, and $W_2$) and features a continuously adjustable capacitance of the type discussed above. In this embodiment, one plate of the adjustable capacitance is supported by coil former 50' as discussed. The oppositely facing plate is supported on a "slip glass" 90, that is, a thin walled quartz or sapphire tube or hollow cylinder supported on the body of the coil former 50'. The inner diameter of the slip glass 90 exceeds the outer diameter of the coil former 50' by an amount sufficient to allow rotation of the slip glass 90 with respect to the coil former. FIGS. 4a and 4b are views of the same coil former 50' from diametrically opposite sides. A resonant coil 83 of arbitrary topology is supported on form 50' and includes terminal stubs 84 and 84'. The coil 83 with its terminal stubs 84, 84' are preferably flush, or substantially so, with a surface of former 50'. The slip glass 90 is shown, for illustrative purposes is shown axially displaced from the former 50' but it is understood that on assembly, it is slid into the position indicated by arrows B and is capable of rotary displacement about the common axis of former 50' and slip glass 90. The capacitor plate $C_T$ is formed on the inner surface (for example) of former 50' and is connected to the coil 83 (as an impedance matching capacitor) and its terminal 98, and terminal 98' supported on former 50' and the movable capacitor plate $C_{T'}$ (connected to coil 83 as a tuning capacitance) forms a tuning capacitance $C_T$ varying as the slip glass 90 is rotated, as for example by a friction drive 95. (The terminals 98 and 98' may be connected to the leads 96, 96', as labeled $L_2$ and $L_3$ in FIGS. 2a and 2b.) The further capability of this arrangement is shown by the rotationally invariant (over a selected angular range) matching capacitance $C_M$ formed from capacitor plate CM supported on former 50' and the corresponding parallel sided capacitor plate CM' supported on slip ring 90 (with appropriate terminals 97, 97'). Thus, rotation of the slip glass provides variation of $C_T$ while maintaining a constant value for the CM over the same angular displacement. Alternatively, CM might be entirely and separately supported on the opposite surfaces of former 50'. It is apparent that relative rotation is the agency for varying the capacitance $C_T$ and the different capacitive plates might be interchanged between the former 50' and the slip glass 90.

A further mode of design variation to consider is suggested by choice of which peripheral surfaces of the former and slip glass for support of constituent conducting plates of a capacitance built into the former/slip glass structures. Two alternative arrangements are evident: (a) for one (the stationary, for example) capacitor plate disposed on the outer surface of the coil former, the adjustable plate is supported on the outer surface of the slip glass and the slip glass wall comprises the dielectric; and (b) for the stationary plate disposed on the inner surface of the coil former, the adjustable plate may be disposed on either inner or outer surface of the slip glass with corresponding difference in dielectric thickness and/or dielectric constant.

The class of slip glass adjustable embodiments is not limited to disposition of the slip glass on the radially outer surface of the coil former, that arrangement being preferred. The preference arises because spatial constraints are commonly encountered inside the cylinder of the coil former (an alternative arrangement), as with the need to provide for RF shields, coil leads and the like.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A balanced NMR probe comprising a resonant circuit for inductive coupling to nuclear spins comprising a sample for study, said resonant circuit comprising:
   a) inductive members;
   b) capacitive members, said capacitive members disposed independently of said inductive members; and
   c) an annular coil former extending along an axis and having a radially inner and outer lateral surfaces surrounding said sample, said former supporting of at least some of said inductive and capacitive members;
      said inductive members comprising a plurality of axially extending planar conductors disposed on one said lateral surface;
      each said capacitive member comprising one pair of planar conductors disposed in facing relationship on respective said inner and outer lateral surfaces.

2. The NMR probe of claim 1, wherein said conductors comprise a susceptibility compensated foil.

3. The NMR probe of claim 2, wherein said inductive members comprise a plurality of azimuthally extending portions of planar conductors for connecting said inductive members to form current loops.

4. The NMR probe of claim 3, wherein said loops form an electrical current path having at least two terminals.

5. The NMR probe of claim 4, wherein each said terminal communicates with a respective one of said pair of planar conductors and said one of said pair is disposed on the same lateral surface as said loops are disposed, whereby each remaining planar conductor comprises a capacitive terminal.

6. The NMR probe of claim 5, further comprising at least two external leads and each said external lead communicates with a respective capacitive terminal.

7. The NMR probe of claim 3, wherein another planar conductor is disposed on that surface opposite to the surface occupied by said loops, and said another planar conductor is arranged whereby a first portion thereof is facing a first portion of one said loop and a second portion of another said loop whereby respective capacitances are formed between said loop portions and said another planar conductor portions and said respective capacitances comprise a series resulting capacitance.

8. The NMR probe of claim 6, wherein another planar conductor is disposed on that surface opposite to the surface occupied by said loops, and said another planar conductor is arranged whereby a first portion thereof is facing a first portion of one said loop and a second portion of another said loop whereby respective capacitances are formed between said loop portions and said another planar conductor portions and said respective capacitances comprise a parallel resulting capacitance.

9. A balanced NMR probe comprising a resonant circuit for inductive coupling to nuclear spins comprising a sample for study, said resonant circuit comprising:
   a) inductive members;
   b) capacitive members, said capacitive members disposed independently of said inductive members;
   c) an annular coil former extending along an axis and having a radially inner and outer lateral surfaces surrounding said sample, said former for support of at least some of said inductive and capacitive members; and
   d) a slip glass in rotationally sliding relationship with a lateral surface of said former, said slip glass comprising inner and outer wall surfaces;
      said inductive members comprising a plurality of axially extending planar conductors disposed on one said lateral surface,
      at least one said capacitive member comprising at least a first planar conductor disposed on a lateral surface of said former and in at least partial facing relationship therewith, a second planar conductor disposed on a lateral surface of said slip glass such that a portion of said slip glass is interposed between said first and second planar conductors.

10. The NMR probe of claim 9, comprising a resonant circuit for inductive coupling to nuclear spins comprising a sample for study, wherein said first planar conductor is disposed on the outer lateral surface of said former and said second planar conductor is disposed on the outer side wall of said slip glass.

11. The NMR probe of claim 9, comprising a resonant circuit for inductive coupling to nuclear spins comprising a sample for study, wherein said first planar conductor is disposed on the inner lateral surface of said former and said second planar conductor is disposed on the outer side wall of said slip glass.

12. The NMR probe of claim 9, comprising a resonant circuit for inductive coupling to nuclear spins comprising a sample for study, wherein said first planar conductor is disposed on the inner lateral surface of said former and said second planar conductor is disposed on the inner side wall of said slip glass.

13. The NMR probe of claims 9, wherein said first and second planar conductors comprise an adjustable capacitance in resonant relationship with said inductive members.

14. The NMR probe of claims 10, wherein said first and second planar conductors comprise an adjustable capacitance in resonant relationship with said inductive members.

15. The NMR probe of claims 11, wherein said first and second planar conductors comprise an adjustable capacitance in resonant relationship with said inductive members.

16. The NMR probe of claims 9, further comprising an RF source/sink wherein said first and second planar surfaces comprise an adjustable capacitance for tuning or matching said resonant circuit in respect to said RF source/sink.

17. The NMR probe of claims 10, further comprising an RF source/sink wherein said first and second planar surfaces comprise an adjustable capacitance for tuning or matching said resonant circuit in respect to said RF source/sink.

18. The NMR probe of claims 11, further comprising an RF source/sink wherein said first and second planar surfaces comprise an adjustable capacitance for tuning or matching said resonant circuit in respect to said RF source/sink.

* * * * *